United States Patent
Kim et al.

(10) Patent No.: US 7,098,407 B2
(45) Date of Patent: Aug. 29, 2006

(54) NON-SOLDER MASK DEFINED (NSMD) TYPE WIRING SUBSTRATE FOR BALL GRID ARRAY (BGA) PACKAGE AND METHOD FOR MANUFACTURING SUCH A WIRING SUBSTRATE

(75) Inventors: Jin-Ho Kim, Gyeonggi-do (KR); In-Ku Kang, Chungcheongnam-do (KR); Hee-Kook Choi, Chungcheongnam-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 95 days.

(21) Appl. No.: 10/850,864

(22) Filed: May 21, 2004

(65) Prior Publication Data

US 2005/0039944 A1    Feb. 24, 2005

(30) Foreign Application Priority Data

Aug. 23, 2003    (KR)    ............... 10-2003-0058511

(51) Int. Cl.
*H05K 1/09*    (2006.01)
(52) U.S. Cl. .................... 174/257; 174/255
(58) Field of Classification Search ........... 174/250, 174/260, 257, 258, 255; 29/846
See application file for complete search history.

(56) References Cited

U.S. PATENT DOCUMENTS

| | | | | |
|---|---|---|---|---|
| 4,766,268 A * | 8/1988 | Uggowitzer | ............... | 174/256 |
| 5,313,021 A * | 5/1994 | Sajja et al. | ................. | 174/260 |
| 5,872,399 A * | 2/1999 | Lee | ............... | 257/738 |
| 5,889,655 A | 3/1999 | Barrow | | |
| 6,169,253 B1 * | 1/2001 | Jairazbhoy et al. | ......... | 174/250 |
| 6,280,828 B1 * | 8/2001 | Nakatsuka et al. | ......... | 428/209 |
| 6,441,316 B1 * | 8/2002 | Kusui | ........................ | 174/260 |
| 6,878,884 B1 * | 4/2005 | Momokawa | ............... | 174/260 |

FOREIGN PATENT DOCUMENTS

| | | |
|---|---|---|
| JP | 2000-277898 | 6/2000 |
| JP | 2001-298117 | 10/2001 |
| KR | 1020010113450 | 12/2001 |
| KR | 2002-0016125 | 3/2002 |
| KR | 2002-0024621 | 4/2002 |
| KR | 2002-0059851 | 7/2002 |
| KR | 2002-0087975 | 11/2002 |

OTHER PUBLICATIONS

English language abstract of Korea Publication No. 1020010113450.

(Continued)

*Primary Examiner*—Ishwar I. B. Patel
(74) *Attorney, Agent, or Firm*—Marger Johnson & McCollom, P.C.

(57) ABSTRACT

In one embodiment, a pad is formed on a substrate surface. The pad is connected with a connecting pattern. A first mask is formed on the substrate. The first mask has a first opening exposing at least a portion of the pad and a portion of the connecting pattern. A second mask is formed on the first mask. The second mask has a second opening exposing at least a portion of the pad and a portion of the connecting pattern. A boundary surface or sidewall of the first opening is not coplanar with a boundary surface or sidewall of the second opening. Therefore, stresses may be prevented from concentrating on the boundary surface of the first opening, thereby allowing dispersion of the stresses and restraining pattern cracks.

10 Claims, 6 Drawing Sheets

OTHER PUBLICATIONS

English language abstract of Korea Publication No. 2002-0059851.
English language abstract of Korea Publication No. 2002-0087975.
English language abstract of Japanese Publication No. 2001-298117.
English language abstract of Japanese Publication No. 2000-277898.
English language abstract of Korean Publication No. 2002-0016125.
English language abstract of Korean Publication No. 2002-0024621.

* cited by examiner

NON-SOLDER MASK DEFINED (NSMD) TYPE WIRING SUBSTRATE FOR BALL GRID ARRAY (BGA) PACKAGE AND METHOD FOR MANUFACTURING SUCH A WIRING SUBSTRATE

CROSS REFERENCE TO RELATED APPLICATIONS

This U.S. non-provisional application claims priority under 35 U.S.C. §119 to Korean Patent Application No. 2003-58511 filed Aug. 23, 2003, the contents of which are incorporated by reference.

BACKGROUND OF THE INVENTION

1. Field of the Invention

The present invention relates to a wiring substrate for a ball grid array (BGA) package and a method for manufacturing such a wiring substrate and in particular, to a wiring substrate having a non-solder mask defined (NSMD) type solder ball pad for a BGA package and a method for manufacturing such a wiring substrate.

2. Description of the Related Art

The electronic industry desires to manufacture products with light weight, small size, high speed, multi-function, high performance and high reliability at competitive prices. The package assembly technique achieves this goal. With the package assembly technique, a ball grid array (BGA) package has been developed. The BGA package has advantages to a conventional plastic package, for example reduced mounting area and improved electrical characteristics.

The BGA package uses a wiring substrate, such as a printed circuit board (PCB), instead of the lead frame used by the conventional plastic package. The wiring substrate provides an entire surface for forming solder balls, allowing improved mounting density on a motherboard.

Referring to FIGS. 1 through 4, a wiring substrate 10 for a BGA package has wiring patterns 30. The wiring patterns 30 include solder ball pads 32 for forming solder balls 50 as external connection terminals. The wiring patterns 30 formed on the lower surface of the wiring substrate 10 are electrically connected to the wiring patterns (not shown) formed on the upper surface of the wiring substrate 10 through via holes 38. The solder ball pads 32 may be non-solder mask defined (NSMD) type solder ball pads. The solder ball pad 32 and a portion of the connecting pattern 34 connected to the solder ball pad 32 are exposed through an opening 43 of a solder mask 40. Reference numeral 24 is an exposed portion of a substrate body 20.

The wiring pattern 30 is formed on the lower surface of the substrate body 20 and may comprise a copper wiring layer. The solder ball pad 32 and a portion of the connecting pattern 34 are exposed through the opening 43 of the solder mask 40 and may be liable to oxidation. After formation of the opening 43, a plating layer 36 is formed to protect the exposed portion of solder ball pad 32 and connecting pattern 34. The plating layer 36 may also establish a reliable connection with the solder ball 50. The plating layer 36 may typically comprise a nickel plating layer 35 and a gold plating layer 37. Before formation of the plating layer 36, an acid cleaning process may be performed for removal of an oxidation film formed on surfaces of the solder ball pad 32 and the connecting pattern 34.

The conventional NSMD type substrate 10 has defects. For example, pattern cracks may occur during a reliability test, such as a thermal cycling test following the manufacture of the BGA package. The pattern crack relates to where a portion of connecting pattern 34 adjacent to a boundary surface 43a is cut off from the boundary surface. The pattern cracks may result from stresses concentrated on the boundary surface 43a located between the opening 43 and the connecting pattern 34, due to the difference of coefficients of thermal expansion (CTE) between the solder mask 40 and the copper wiring layer materials being great. The CTE of a typical solder mask 40 is $60 \times 10^{-6}/C.°$ or $160 \times 10^{-6}/C.°$ depending on the material, while that of a typical substrate body 20 is $16 \times 10^{-6}/C.°$ and typically a copper wiring layer has a CTE of $16 \times 10^{-6}/C.°$.

Further, the exposed solder ball pad 32 and connecting pattern 34 may be etched during the acid cleaning process. The exposed connecting pattern 34 may thereby be thinner than the connecting pattern 34 covered by the solder mask 40. The difference of thickness may generate a step 33 at the boundary surface 43a.

As described above, the plating layer 36 is formed on the copper wiring layer including the solder ball pad 32 and the connecting pattern 34. The boundary surface 43a may form a boundary between a copper/nickel/gold structure and a copper/solder mask structure.

Accordingly, stresses may concentrate on the boundary surface 43a during thermal cycling. The pattern cracks may occur at the connecting pattern 34 located adjacent to a relatively weak portion, i.e. the boundary surface 43a.

SUMMARY OF THE INVENTION

The present invention is directed toward a non-solder mask defined (NSMD) type wiring substrate for a ball grid array (BGA) package and a method for manufacturing such a wiring substrate in which concentration of stresses on a boundary surface between a wiring pattern and a solder mask may be reduced, thereby decreasing pattern cracks.

In one embodiment, a method for manufacturing a NSMD type wiring substrate for a BGA package comprises providing a wiring substrate having a wiring pattern. The wiring pattern may be made of copper. The wiring pattern may include, for example, a solder ball pad and a connecting pattern. In this embodiment a first solder mask may be formed on a surface of the substrate body. The first solder mask has a first opening which exposes at least a portion of the solder ball pad and a portion of the connecting pattern. A plating layer may then be formed on the exposed solder ball pad and connecting pattern. A second solder mask may then be formed to cover the first solder mask. The second solder mask has a second opening which exposes at least a portion of the solder ball pad and a portion of the connecting pattern. The second opening may be distinct from the first opening, for instance, by having an inner diameter from the center of the solder ball pad less than that of the first opening. Therefore, the second solder mask may protect a boundary surface of the first opening.

After formation of the first solder mask and before formation of the plating layer, an acid cleaning step may be performed to remove an oxidation film formed on the exposed solder ball pad and connecting pattern.

The plating layer may be formed by forming a nickel plating layer on the exposed solder ball pad and connecting pattern and forming a gold plating layer on the nickel plating layer.

The distance between the first and second openings may be tens of μm to hundreds of μm to protect the boundary surface.

In one embodiment, a NSMD type wiring substrate for a BGA package may comprise a substrate body. A wiring pattern can then be made of copper and formed on a surface of the substrate body. The wiring pattern may then have a solder ball pad and a connecting pattern connected to the solder ball pad.

In the present embodiment, a first solder mask can then be formed on a surface of the substrate body. The first solder mask may have a first opening which exposes at least a portion of the solder ball pad and a portion of the connecting pattern. A plating layer can then cover the exposed solder ball pad and connecting pattern. A second solder mask can be formed on the first solder mask. The second solder mask may have a second opening which exposes at least a portion of the solder ball pad and a portion of the connecting pattern. The second opening may be smaller than the first opening in inner diameter from the center of the solder ball pad. The second solder mask may protect a boundary surface of the first opening.

Furthermore, the two openings need not be the same shape, nor need have a consistent distance between them. Advantages of the present examples extend to other geometries where the solder masks, or any mask placed adjacent to the connecting patters at the boundary surface, are not coplanar with the boundary surface. In this way, at least one of the solder masks can absorb some of the stresses that otherwise would concentrate on the boundary surface and cause pattern cracks or other harm.

BRIEF DESCRIPTION OF THE DRAWINGS

Embodiments of the present invention will now be described by way of example only, with reference to the following drawings.

FIG. 7 is a plan view illustrating a step for forming a first solder mask on the lower surface of the substrate;

FIG. 8 is a cross-sectional view, taken along line 8—8 of FIG. 7;

FIG. 9 is a cross-sectional view illustrating an acid cleaning step;

FIG. 10 a cross-sectional view illustrating a step for forming a plating layer; and FIG. 11 is a cross-sectional view illustrating a step for forming a second solder mask.

DETAILED DESCRIPTION OF THE INVENTION

Figure 1:
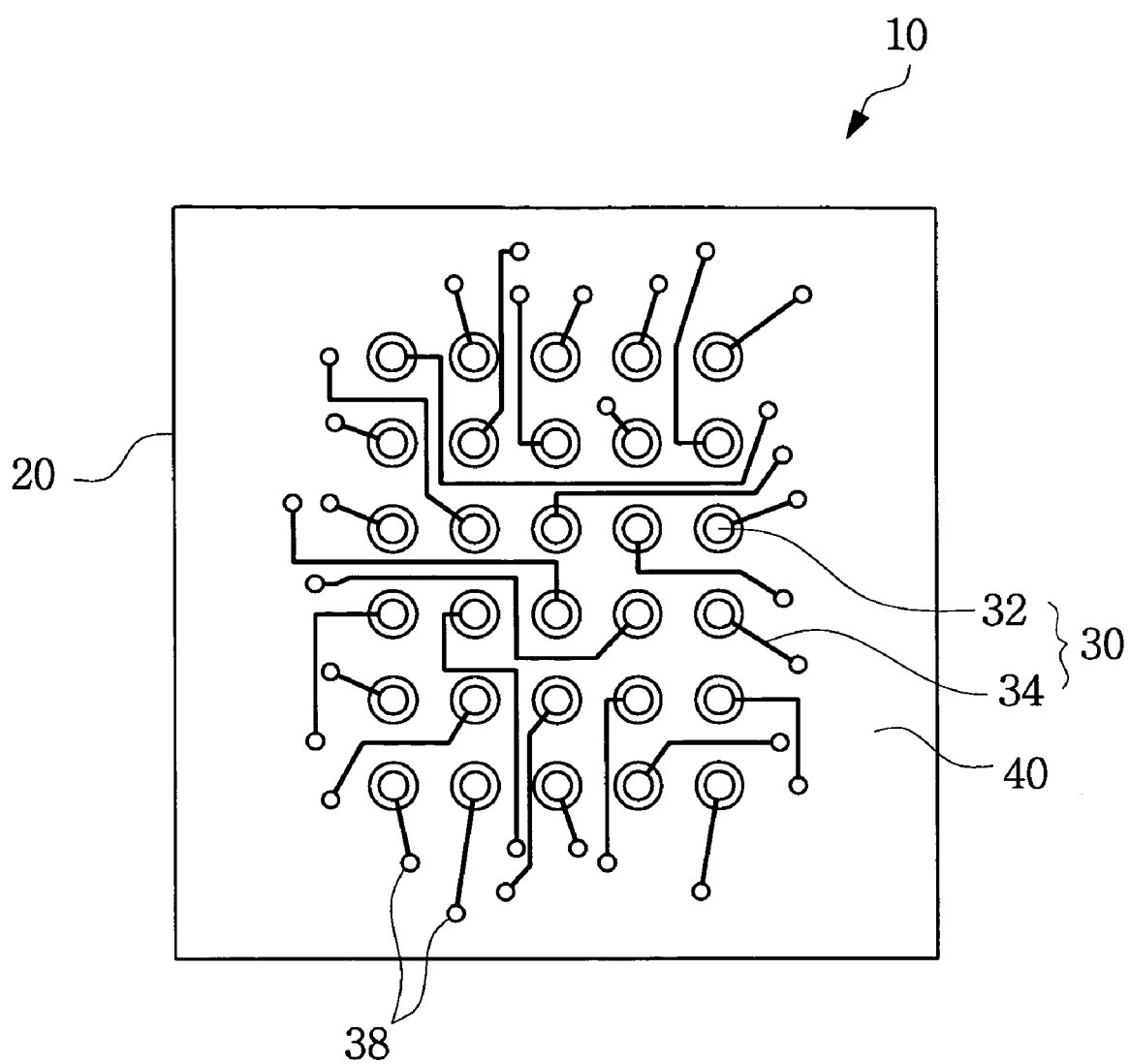
FIG. 1 is a plan view of a conventional NSMD type wiring substrate for a BGA package.
Figure 2:
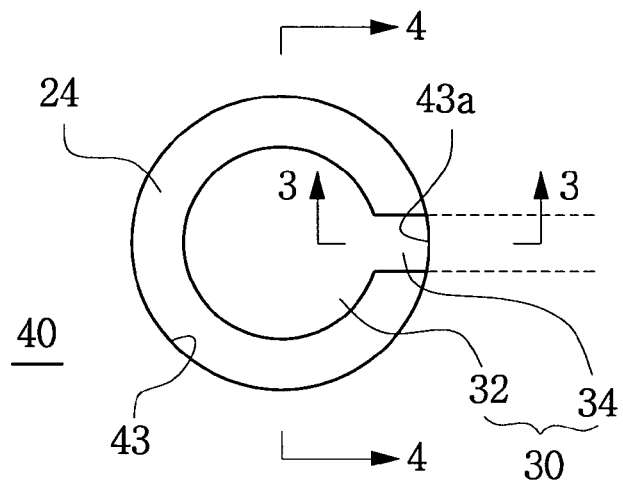
FIG. 2 is an enlarged plan view of a wiring pattern including a solder ball pad and a connecting pattern of FIG. 1.
Figure 3:
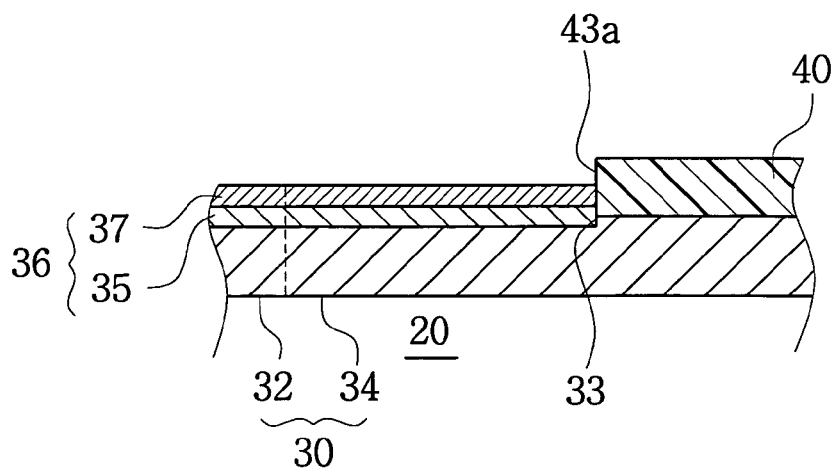
FIG. 3 is a cross-sectional view of the wiring pattern structure, taken along line 3—3 of FIG. 2.
Figure 4:
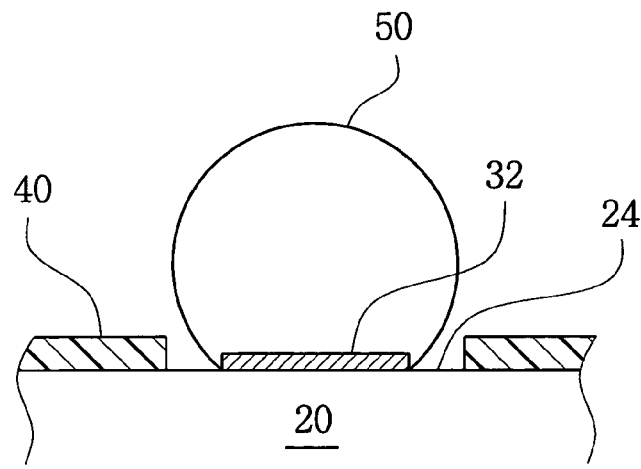
FIG. 4 is a cross-sectional view of the solder ball pad, taken along line 4—4 of FIG. 2.

For convenience, like numerals in the description refer to like structures in the drawings. The invention described herein provides a method and apparatus that can be used for improving electronic packaging robustness.

Figure 5:
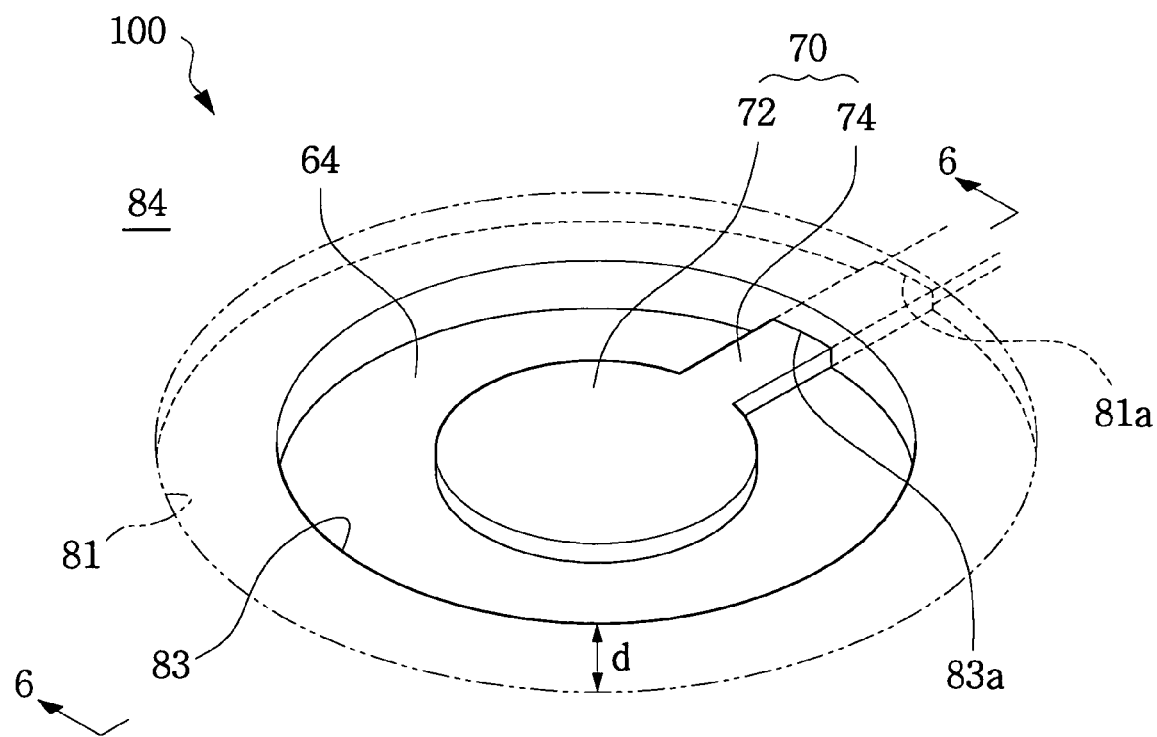
FIG. 5 is a perspective view of a NSMD type wiring substrate for a BGA package in accordance with an embodiment of the present invention.
Figure 6:
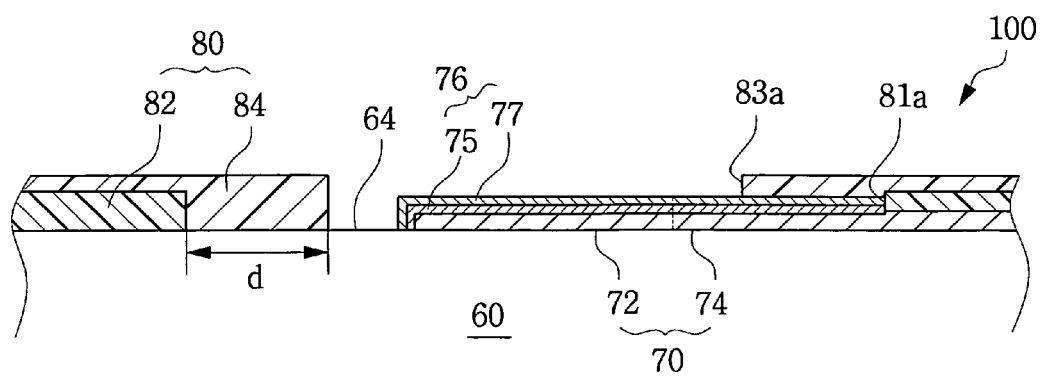
FIG. 6 is a cross-sectional view taken along line 6—6 of FIG. 5.

FIG. 5 is a perspective view of an exemplary NSMD type wiring substrate 100 for a BGA package in accordance with an embodiment of the present invention. FIG. 6 is a cross-sectional view, taken along line 6—6 of FIG. 5.

Referring to the embodiment in FIGS. 5 and 6, the wiring substrate 100 may include a substrate body 60, a wiring pattern 70 formed on the substrate body 60 and a solder mask 80 for protecting the wiring pattern 70. The wiring pattern may further include a solder ball pad 72 and a connecting pattern 74 connected to the solder ball pad 72. A solder mask 80 can have an opening 83 which exposes at least a portion of the solder ball pad 72 and a portion of the connecting pattern 74. Therefore, the structure of the present embodiment is preferably a double solder mask for preventing pattern cracks. However, additional solder mask can be formed depending on manufacturing objectives.

One solder mask 82 is hereinafter referred to as a first solder mask and the other solder mask 84 formed on the first solder mask 82 is hereinafter referred to as a second solder mask.

In the present embodiment, the first solder mask 82 may be formed on a surface of the substrate body 60. The first solder mask 82 may have a first opening 81 which exposes at least a portion of the solder ball pad 72 and a portion of the connecting pattern 74. A plating layer 76 may then be formed on the exposed solder ball pad 72 and connecting pattern 74. The second solder mask 84 may then be formed on the first solder mask 82. The second solder mask 84 can have a second opening 83 which exposes at least a portion of the solder ball pad 72 and a portion of the connecting pattern 74. The second opening 83 may be smaller than the first opening 81, for instance in inner diameter from the center of the solder ball pad 72. Other embodiments provide geometries where the openings are not coplanar, or more particularly, where a single line cannot exist planar to both surfaces concurrently, where the surface is the interior face or sidewall surface of the opening, for example, in the boundary area. (See FIG. 6)

In the present embodiment, a portion of the connecting pattern 74 adjacent to a boundary surface 81a of the first opening 81 may be covered with the second solder mask 84. Furthermore, for efficiency, the exposed and covered portions of the connecting pattern 74 with regard to a boundary surface 83a of the second opening 83 may both have the same plating layer 76.

Accordingly, the present embodiment may reduce stresses resulting from the difference of materials between the exposed and covered portions of the connecting pattern, and in particular will reduce thermal stresses at the boundary surface. Further, the first opening 81 may be overlapped by the second opening 83, which may prevent stresses from concentrating on the boundary surface 81a of the first opening 81. Thereby pattern cracks may be restrained.

In one embodiment, the distance (d) between the first opening 81 and the second opening 83 may be tens of $\mu m$ to hundreds of $\mu m$ so that the boundary surface 81a of the first opening 81 can be protected by the second solder mask 84.

FIGS. 7 through 11 are views illustrating steps of forming an exemplary NSMD type wiring substrate in accordance with an embodiment of the present invention.

Figure 7:
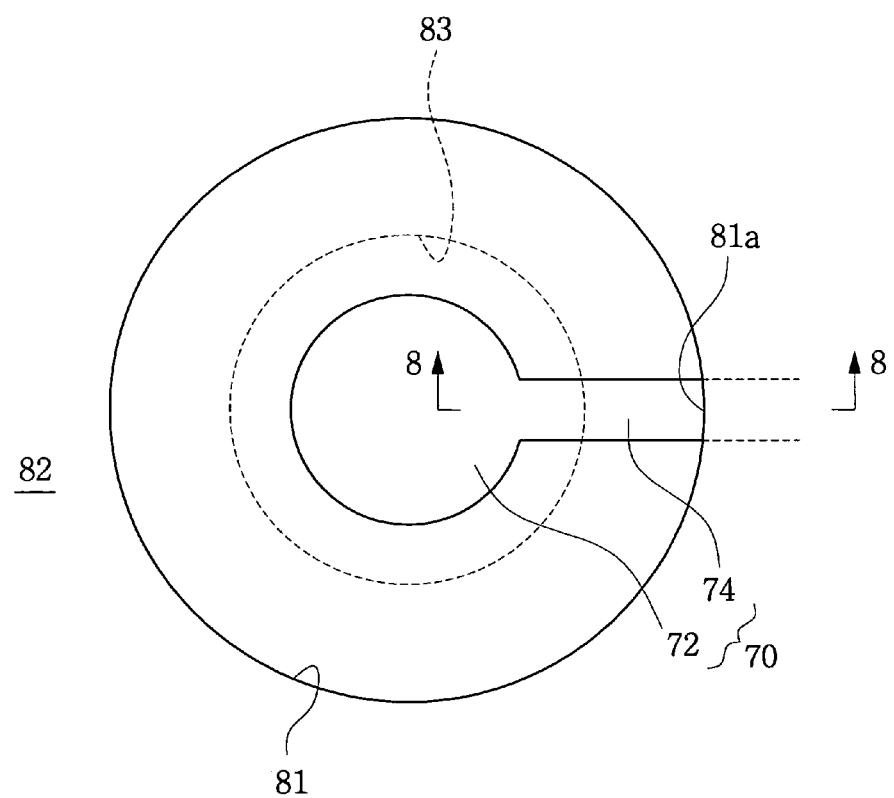
FIGS. 7 through 11 are views illustrating steps of forming such a NSMD type wiring substrate in accordance with an embodiment of the present invention.
Figure 8:
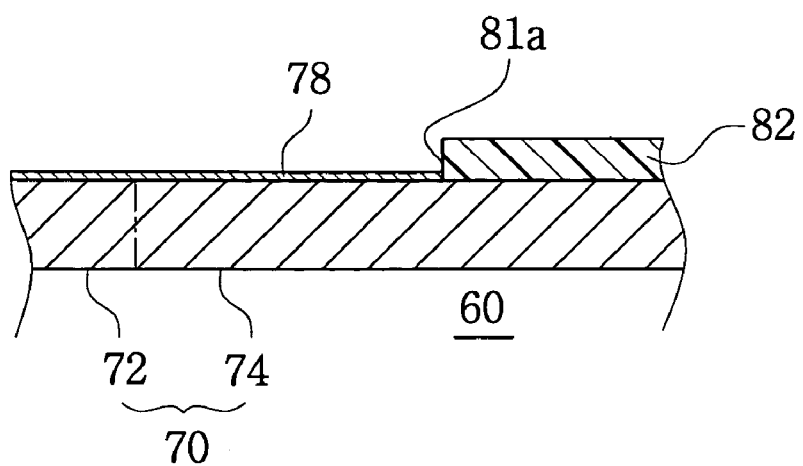

Referring to FIGS. 7 and 8, a wiring substrate having a substrate body 60 is provided. The substrate body 60 has a wiring pattern 70 formed on a surface thereof. In the present embodiment the wiring pattern may be copper. The wiring pattern 70 may further include a solder ball pad 72 and a connecting pattern 74 connected to the solder ball pad 72. The substrate body 60 may be a BT resin insulating plate or an epoxy glass (FR-4) insulating plate or any other suitable substrate material as known in the art. The wiring pattern 70 may comprise a copper wiring layer formed by a photo etching technique. The wiring pattern 70 may be arranged on both surfaces of the substrate body 60, if a small number of input/output pins of a BGA package are required. The wiring pattern 70 may be arranged in the substrate body 60 as well, if a large number of input/output pins of a BGA package are required.

In the present embodiment, the other surface of the substrate body 60 has a chip mounting area and a wiring pattern to be electrically connected to a chip, although not shown. The wiring pattern formed on one surface of the substrate body 70 may be electrically connected to the wiring pattern formed on the other surface of the substrate body 70 by inner wirings or via holes, or any connection allowing electrical communication between the wiring patterns.

Next, a first solder mask 82 may be formed on a surface of the substrate body 60. The first solder mask 82 may have a first opening 81 which exposes at least a portion of the solder ball pad 72 and a portion of the connecting pattern 74.

Figure 9:
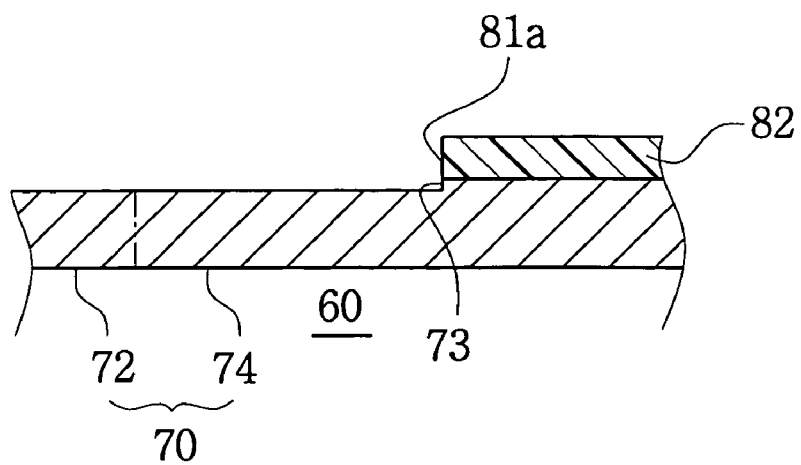

Referring to FIG. 9, a cleaning process is performed. In the present embodiment the cleaning process is an acid cleaning process. The cleaning process may remove an oxidation film (78 of FIG. 8) for good formation of a plating layer on the exposed solder ball pad 72 and connecting pattern 74. During removal of the oxidation film 78, a portion of the exposed solder ball pad 72 and connecting pattern 74 may also be removed. In the present embodiment, the connecting pattern 74 has a width of 120 µm and a thickness of 18 µm before the acid cleaning process. After the acid cleaning process, the exemplary exposed connecting pattern 74 may be reduced by a width of at least 7 µm and a thickness of approximately 3 µm. As a result, the connecting pattern 74 has a step 73 with regard to the boundary surface 81a of the first opening 81. The measurements in the present embodiment are for illustration purposes, the present invention is not constrained to these values in any way.

Figure 10:
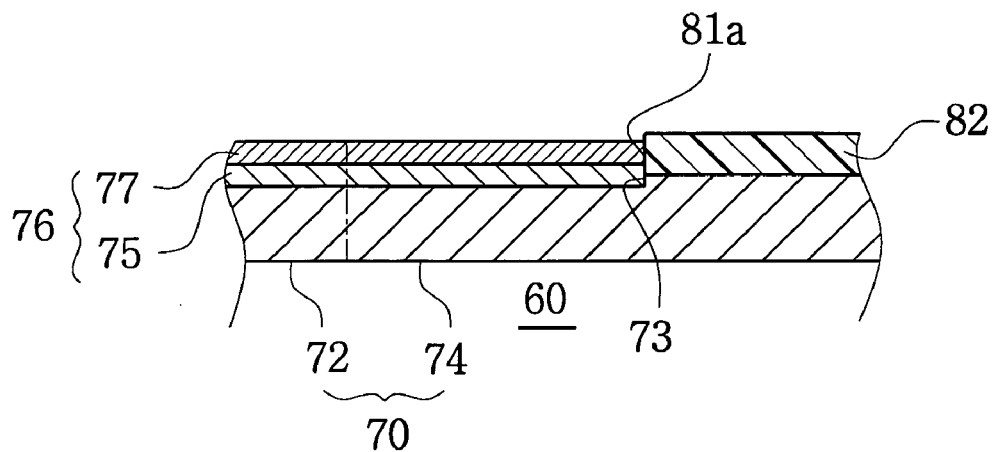

Referring to FIG. 10, a plating layer 76 may be formed. A nickel plating layer 75 may be formed on the exposed solder ball pad 72 and connecting pattern 74, then a gold plating 77 is formed on the nickel plating layer 75.

Figure 11:
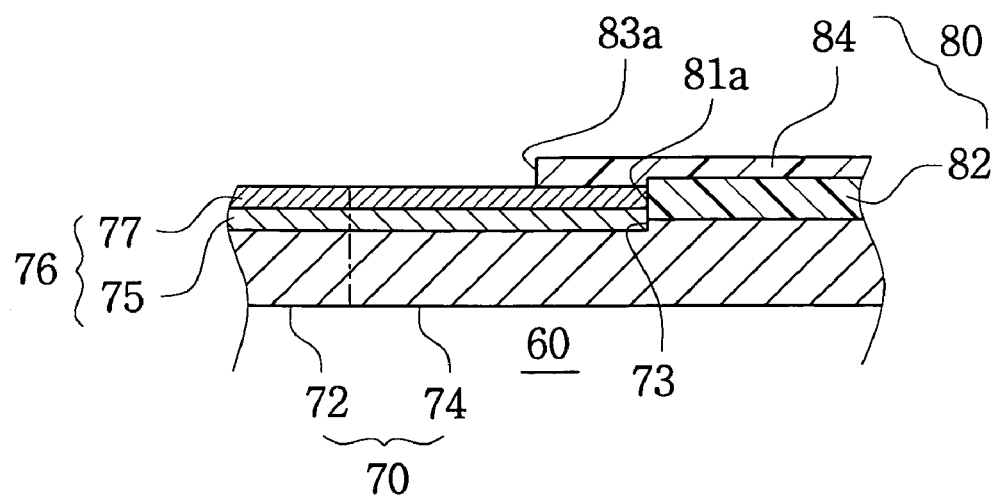

Referring to FIG. 11, a second solder mask 84 may be formed to cover the first solder mask 82. The second solder mask 84 has a second opening 83 which exposes at least a portion of the solder ball pad 72 and a portion of the connecting pattern 74. The second opening 83 may be smaller than the first opening 81, for instance in inner diameter from the center of the solder ball pad 72. In this embodiment, the boundary surface 81a of the first opening 81 is covered with the second solder mask 84. Other embodiments provide the similar benefits of reducing stresses in the boundary region by placing layers or masks near each other in a non coplanar fashion relative to the boundary surface, thus effectively homogenizing or averaging the material properties more effectively through the geometry of the package.

Therefore, in the present embodiment, the difference between the inner diameters of the first opening and the second opening may result in the first and second openings having an overlapped configuration. Stresses may be prevented from concentrating on the boundary surface 81a of the first opening 81, allowing dispersion of the stresses. Further, the present invention may compensate for the difference of metal materials between the exposed covered portions of the connecting pattern, reducing thermal stresses. Thereby pattern cracks may be reduced.

Although the invention has been described with reference to certain specific embodiments, various modifications thereof will be apparent to those skilled in the art without departing from the spirit and scope of the invention as outlined in the claims appended hereto.

What is claimed is:

1. A package comprising: a substrate; a pad on a substrate surface, the pad connected with a connecting pattern; a first mask on the substrate, the first mask having a first opening exposing at least a portion of the pad and a portion of the connecting pattern; a plating layer on the exposed pad and connecting pattern; and a second mask on the first mask, the second mask having a second opening exposing at least a portion of the pad and a portion of the connecting pattern, wherein a boundary surface of the first opening is not coplanar with a surface of the second opening, wherein the pad is spaced apart from the first and the second masks, the boundary surface of the first opening, including vertical edge is protected by the second mask.

2. The package of claim 1, wherein the second opening is smaller than the first opening.

3. The package of claim 1, wherein the plating layer comprises:
   a nickel plating layer formed on the exposed pad and connecting pattern; and
   a gold plating layer formed on the nickel plating layer.

4. The package of claim 3, wherein the distance between the first opening and the second opening is tens of µm to hundreds of µm.

5. The package of claim 1, wherein the pad is spaced apart from the first and the second masks by a circular opening within the second opening.

6. The package of claim 1, wherein the entire pad is exposed by the second opening.

7. The package of claim 6, wherein the second mask conceals the entire first mask.

8. The package of claim 1, wherein the pad is circular having a single diameter.

9. A package comprising: a substrate; a pad on a substrate surface, the pad being in electrical communication with a connecting pattern; a first mask on the substrate, the first mask exposing at least a portion of the pad and a portion of the connecting pattern; and a second mask on the first mask, the second mask exposing at least a portion of the pad and a portion of the connecting pattern, wherein the second mask is offset from the first mask, wherein the pad is spaced apart from the first and the second masks, the boundary surface of the first opening, including vertical edge is covered by the second mask.

10. The package of claim 9, wherein the second opening is smaller than the first opening.

* * * * *